United States Patent

[11] 3,588,876

[72] Inventors Andre Edouard Joseph Chatelon Montrouge; Claude Paul Henri Lerouge, Montgeron; Herve Jean Pierre Marie Louboutin, Palaiseau, France

[21] Appl. No. 666,164
[22] Filed Sept. 7, 1967
[45] Patented June 28, 1971
[73] Assignee International Standard Electric Corporation New York, N.Y.

[54] ENCODER FOR WIDE BAND SIGNALS
10 Claims, 21 Drawing Figs.

[52] U.S. Cl. ........................................................ 340/347
[51] Int. Cl. ........................................................ H03k 13/02
[50] Field of Search ........................................... 340/347 (AD); 179/15 (APC), 15 (BWR)

[56] References Cited

UNITED STATES PATENTS 2,956,271 10/1960 Keller .......................... 340/347
3,221,159 11/1965 Cook et al. .................. 340/347X

*Primary Examiner*—Maynard R. Wilbur
*Assistant Examiner*—Michael K. Wolensky
*Attorneys*—C. Cornell Remsen, Jr., Rayson P. Morris, Percy P. Lantzy, Philip M. Bolton and Isidore Togut

ABSTRACT: *m* sample and hold, amplitude comparison and logic circuits are activated by timing signals during the rise time of cyclic ramp signals to produce write and read signals. Each circuit produces a write signal when the amplitudes of an analog signal and one of the ramp signals are equal and simultaneously the associated ones of the timing signals are absent in the rise time of said one of said ramp signals to transfer the count of the *n* least significant binary weighted stages of an (*n*+1) stage coding counter to associated columns of an *m*-line, *n*-column memory and a read signal when the associated ones of the timing signals are present in the rise time of the next succeeding one of said ramp signals to transfer the stored code to external circuits.

INVENTORS
ANDRE E. J. CHATELON
CLAUDE P. H. LEROUGE
HERVE J. P. M. LOUBOUTIN
BY Alfred C. Hill
AGENT

PATENTED JUN 28 1971 3,588,876

SHEET 2 OF 3

Inventors
ANDRE E. J. CHATELON
CLAUDE P. H. LEROUGE
HERVE J. P. M. LOUBOUTIN
By Alfred C. Hill
Agent Inventors
ANDRE E. J. CHATELON
CLAUDE P. H. LEROUGE
HERVE J. P. M. LOUBOUTIN
By Alfred C. Hill
Agent

ENCODER FOR WIDE BAND SIGNALS

BACKGROUND OF THE INVENTION

The present invention relates to an encoder for coding one or several wide band signals, and more particularly to an encoder having a constant coding duration which uses, as a reference voltage, a ramp or staircase signal.

Two main known coding techniques are called "feedback coding" and "time modulation coding" which produces a binary number representing the magnitude of the amplitude of an analog sample.

In one feedback coding system, the amplitude of the sample taken across the terminals of a condenser is compared to the voltage obtained by decoding a binary number stored in a register in order to determine whether said number is too big or too small. In the first case, the binary number is reduced, and in the second case, it is increased, by modifying one of its digits. The comparison operations are carried on, by modifying digits in the direction of decreasing weights, up to the time where the compared voltages differ, by no more than the value of one quantizing step. The binary number stored in the register corresponds then to the value of the sample. It will be noted that the coding duration is constant, and proportional to the number of digits $n$ of the binary number, and to the number of channels $m$ when a time multiplex coding is employed.

In time modulation coding, the signal to be coded is compared to a ramp or staircase voltage, the triggering of which is synchronized with that of a pulse generator. The pulses control the advance of a counter up to the time where the amplitudes of the compared signals are equal. The maximum amplitude which may be reached by the ramp signal is equal to the maximum amplitude of the signal to be coded, and it is represented by the highest binary number which may be stored in the counter. Under these conditions, the number stored in said counter at the time of blocking the pulse generator corresponds to the amplitude of the signal to be coded. Since this blocking controls the zeroing of the ramp signal, the duration of the coding operations itself is variable and proportional to the amplitude of the signal to be coded.

There is described in a copending application of A. E. J. Chatelon, Ser. No. 566,035, filed July 18, 1966, a coding arrangement having a constant coding duration which uses, as a reference voltage, a ramp or staircase signal of period Tz. In this coder, which does not include a sampling device, $(m-1)$ comparison circuits are assigned to each one of $(m-1)$ channels and in which the signal to be coded is permanently compared to the reference signal. When one of these circuits deliver a signal characterizing the equality between the compared voltages the number stored at this time in a coding counter, which operates in the same way as in a time modulation coder, is transferred to one line of memory assigned to this channel. At the end of the frame period of the reference signal, a time interval of duration $Tz/m$ has been reserved during which the contents of the memory, that is, the $(m-1)$ codes obtained during the first part of the period Tz, are transferred to a second memory which has available nearly the total time for transmitting the $(m-1)$ codes to which is added a $m^{th}$ code used, in the received terminal, for frame synchronization. The rate of transmission of information Φ is, in the case of a series transmission, $$\Phi=(m)(n)/(Tz) \qquad (1)$$

digits per second, where $n$ is the number of digits per code. In order to comply with the sampling theorem $1/(Tz)=2(k)(F'c)$, where $(F'c)$ is the maximum frequency of the signals to be coded and $(k)$ is a coefficient having a value equal to or higher than one. Therefore, equation (1) may be written $$\Phi=2(k)(m)(n)(F'c) \qquad (2)$$

It is thus seen that, for a given rate, which, for instance, is dependent on the capacity of the transmission channel, $(m)$, $(n)$ and $(F'c)$ may vary, under the condition that their product remains constant. At the limit, if only one single signal is coded, equation (2) may be written $$\Phi=2(k)(n)(Fc) \qquad (3)$$

with $(Fc)=(m)(F'c)$.

SUMMARY OF THE INVENTION

If equation (1) is rewritten as follows: $(Tz)=(m)(n)/\Phi$ and equation (3) is substituted for Φ there is obtained:

$$(Tz)=\frac{(m)(n)}{2(k)(n)(Fc)}=\frac{(m)}{2(k)(Fc)} \qquad (4)$$

According to the present invention the factor $(m)$ of equation (4) represents the number of samplings of the signal to be coded during the period (Tz).

An object of the present invention is to provide a wide band coder of constant coding duration with a reference signal in the form of a ramp or staircase signal.

A feature of this invention is the provision of an encoder for wide band signals comprising $(n+1)$ stage coding counter means, an $m$-line, $n$-column memory means each of the $n$-columns coupled to a different one of $n$ selected ones of the stages the counter means, an input for a single wide band analog signal, first means to generate cyclic reference signals each having a given rise time and a given return time, $m$ second means having their inputs coupled in common to the analog signal input and the first means and their outputs coupled to respective ones of the lines of the memory means, and third means to produce sequential timing signals during each of the reference signals, the third means being coupled to each of the second means for activation thereof, by associated ones of the timing signals and coupled to the counter means for activation thereof by a selected one of the timing signals, each of the second means comparing the amplitude of one of the reference signals with the amplitude of the analog signal and producing a write signal during said one of the reference signals and the simultaneous absence of the associated ones of the timing signals, and each of the second means producing a read signal during the next succeeding one of the reference signals after said one of the reference signals and the simultaneous presence of the associated ones of the timing signals, each of the write signals transferring the count of the $n$ selected ones of the stages of the counter means at that time to the associated one of the lines of the memory means, and each of the read signals transferring the stored count to external means.

BRIEF DESCRIPTION OF THE DRAWINGS

The above-mentioned and other features and objects of this invention will become more apparent by reference to the following description taken in conjunction with the accompanying drawings, in which.

DESCRIPTION OF THE PREFERRED EMBODIMENTS

Figure 1A:
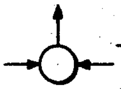
FIGS. 1*a* to 1*g* represent symbols employed in the block diagrams of FIGS. 2 and 4.

FIG. 1*a* represents a simple AND circuit.

Figure 1B:
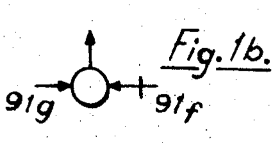

FIG. 1*b* is a symbol for an AND circuit having two input terminals **91*f*, 91*g* and which is blocked when a signal is applied over the input 91*f***, in other words, FIG. 1*b* is a symbol for an INHIBIT circuit.

Figure 1C:
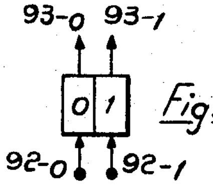
Figure 1D:
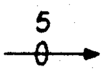
Figure 1E:
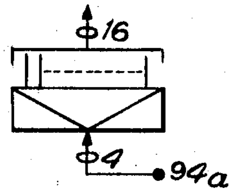
Figure 1F:
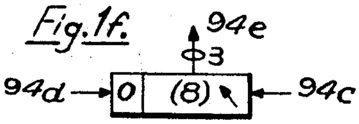
Figure 1G:
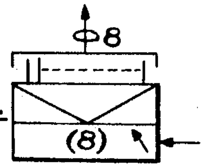

FIG. 1*c* is a symbol representing a bistable or flip-flop circuit to which a control signal is applied over one of its input terminals 92–1 or 92–0 in order to set it in the "1" state or to reset it in the "0" state. The voltage of the same polarity as that of the control signal is present, either on the output 93–1 when the flip-flop is in the "1" state, or on the output 93–0 when it is in the "0" state. If the flip-flop is referenced B, the logical condition which characterizes the fact that it is in the "1" state will be written B and that characterizing the fact that it is in the "0" state will be written $\bar{B}$. It is assumed that the switching time of such a circuit is lower than the duration of a basic time slot which will be defined hereinbelow.

FIG. *1d* is a symbol representing a group of several conductors, 5 in the illustrated example.

FIG. *1e* is a symbol representing a decoder which, in the illustrated example, transforms a four-digit binary code group applied over the group of conductors 94a into a one out of 16 codes, so that a signal appears on only one of the 16 conductors 94b for each one of the code groups applied at the input.

FIG. *1f* is a symbol representing a flip-flop or binary counter which counts the pulses applied to its input terminal 94c and which is cleared by the application of a signal on its input 94d. The "1" outputs of the flip-flop are connected to the output conductors 94e.

FIG. *1g* is a symbol representing a selector or generator constituted by the combination of a register (counter) and a decoder such as illustrated in FIGS. *1f* and *1e*.

Figure 2:
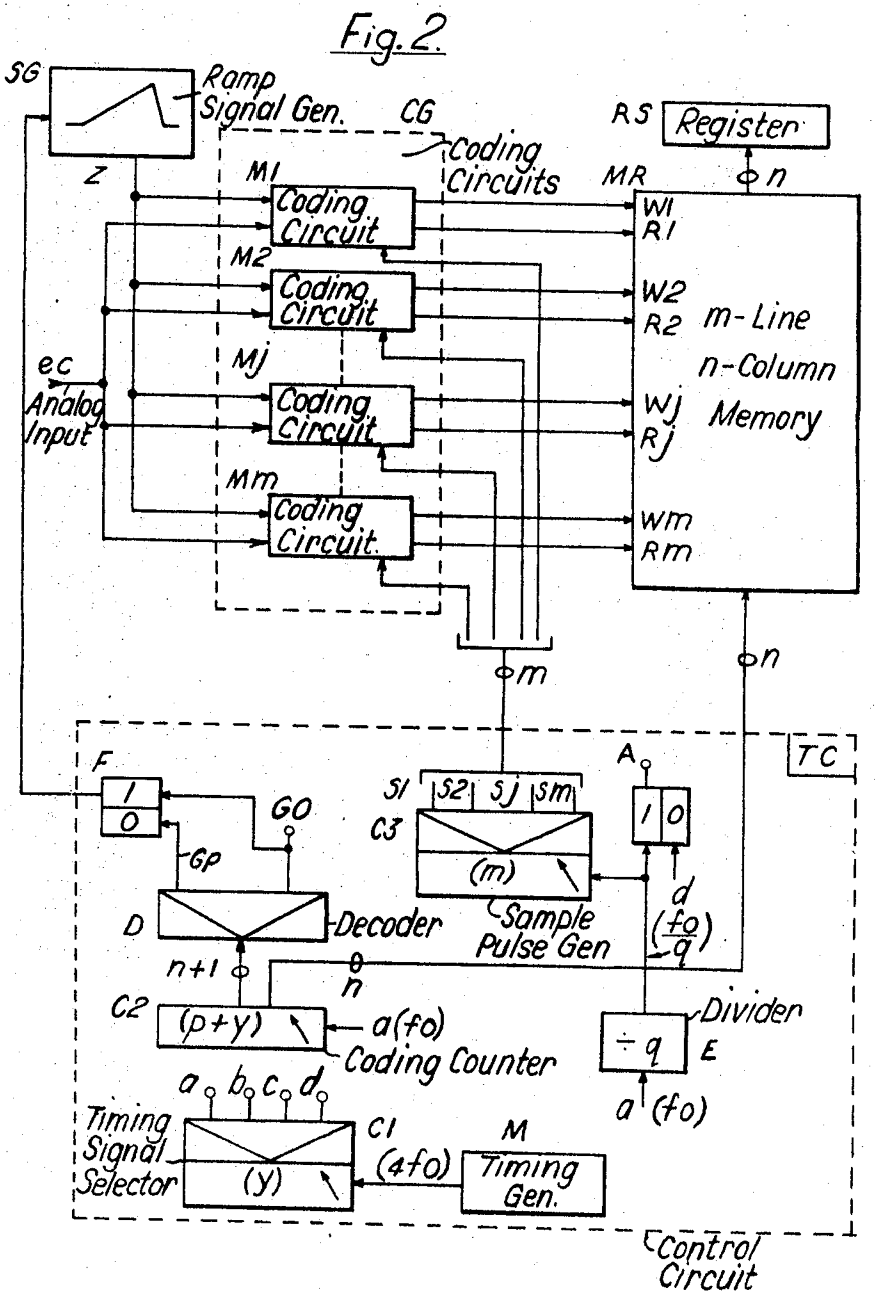
FIG. 2 is a block diagram of the encoder according to the principles of the present invention.

Referring to FIG. 2, there is illustrated therein in block diagram form the coder in accordance with the principles of the present invention which comprises the ramp signal generator SG, the group of coding circuits CG, the *m*-line, *n*-column memory MR with its output register RS and the control circuit TC.

In control circuit TC, generator M delivers signals of frequency 4*fo* which are applied to the selector C1 to deliver basic time slot signals *a*, *b*, *c*, *d* of equal duration and of frequency *fo*. The signal *a* is applied to the frequency divider E which delivers signals of frequency *fo*/*q* and to the coding counter C2 having a capacity of $(n+1)$ digits where $2^n=p$. In the example illustrated, counter C2 is so designed as to produce $(p+y)$ different codes in a nonredundant binary code (natural binary code, or Gray code) with $(p+y)<2^{(n+1)}$. The successive codes generated by counter C2 are references G0, G1, G2...G $(p+y-1)$. Decoder D which is coupled to counter C2 delivers signals when the counter produces the codes G*o*=G*py* and G*p*, these signals bearing the same references as the corresponding codes. Flip-flop F is reset to the "0" state by the signal G*p* and to the "1" state by the signal G*o*. The output signal F is applied to the control terminal of generator SG to define the rise time $(p)(t_o)$ of the ramp signal Z of maximum amplitude E*c*. The signal $\bar{F}$ defines when the maximum value $(y)(t_o)$ of the return time of this signal is achieved ($t_o$= 1/*fo*). The signals delivered by divider E are applied to the sampling pulse selector or sample pulse generator C3 which comprises a counter and a decoder, the counter having a capacity of *r* digits with $2^r>m>2^{(r1)}$. In the illustrated example, the counter of generator C3 is so designed as to present *m* different states which correspond to the sampling signals S1, S2,...S*j*...*m*, the whole of which define a sampling cycle of duration T*s*=$(m)(q)(t_o)$. The signals delivered by divider E are also applied to flip-flop A which is reset to the "0" state in the basic time slot *d* and which delivers, on its "1" output, a signal A which covers at least the basic time slots *b* and *c* at the beginning of each one of the sampling signals S1 to S*m*. The group of coding circuits CG comprises *m* coding circuits M1, M2...M*j*...*m* to which are applied the signal to be coded $e_c$ ($0\leq e_c\leq E_c$) and the ramp signal Z. These coding circuits are activated in time sequence by the sampling signals S1 to S*m*.

The memory MR comprises *m* lines, each one enabling the storage, under control of signals W1, W2...W*j*...W*m* of a number stored in the coding counter C2. The readout is controlled by signals R1, R2...R*j*...R*m* which appears cyclically and the codes read are transferred successively into register RS in order to be transmitted to utilization circuits in serial or parallel form.

As it has just been seen the cycle duration of the ramp signal Z is:

$(Tz)=(p+y)(t_o)$

For reasons which will be explained hereinbelow, $(Tz)=(Ts)-(qt_o)$, that is, the difference of duration between both cycles is equal to the value of one sampling time slot. Thus, :

$(Tz)=(m-1)(q)(t_o)$ and $(Tz)/(t_o)=p+y=(m/1)(q)$ (5)

FIGS. *3a*, *3b*, *3c* illustrate the meaning of the parameters *p*, *y*, *q* and *m* which have just been mathematically defined.

FIG. *3a* represents three successive cycles T1, T2, T3 of the ramp signal with a rise time $(p)(TO)$ and a maximum return time $(y)(to)$ defined respectively by the signals F and $\bar{F}$ (circuit TC, FIG. 2).

FIG. *3b* illustrates the successive states G*o*, G1...G $(p+y-)$, G*o* of coding counter C2.

FIG. *3c* illustrates the successive states S1, S2...S*m* , S1...of sample pulse generators C3. It will be noted that by way of a nonlimiting example *q* and *y* have been chosen equal to two and that, according to equation (5), $(m-1)$ samplings are performed during a period Tz.

FIG. *3d* illustrates the signals S'1, S'2,...S', S'1...which appear at the beginning of the sampling time. Signal S'2, for instance, appearing for the logical condition S'2=(A)(S2).

Figure 4:
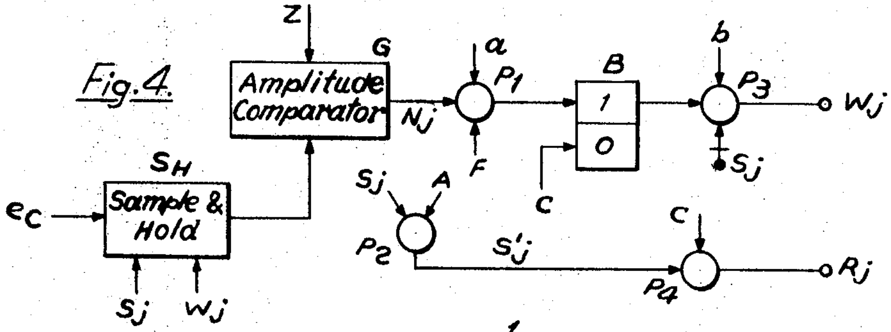
FIG. 4 is a block diagram of one of the coding circuits employed in the coder of FIG. 2.

FIG. 4 illustrates one of the coding circuits M, such as coding circuit M*j*, which comprises the sampling and holding circuit SH, amplitude comparator G, flip-flop B and AND circuits P1 to P4.

Sampling and holding circuit SH comprises a capacitor which plays the role of an analog memory and which is charged to the value $e_c$ of the voltage to be coded when a sampling gate is opened under the control of signal S*j*. A signal W*j*, which means that the value of this sample has just been coded, controls the opening of a gate controlling the discharge of said capacitor. The voltage across the terminals of the capacitor is applied through a high input impedance amplifier to comparator G which also receives the ramp signal Z and delivers a signal N*j* when these two voltages are equal. These circuits, which are used in all time multiplex coding systems, are well known and have not been illustrated in detail in FIG. 4.

More precisely, since coding counter C2 (FIG. 2) defines $2^n$ quantizing steps for an amplitude of the ramp signal Z between zero and $E_c$, the value of one of said steps is $u=E_c/2^n$ and this step is crossed by the ramp signal in a time $t_o$. This range of measurement of the comparator must thus be *u* volts and a signal N*j* lasts for a time $t_o$, that is, it covers four successive basic time slots, one of which is *a*. The signal N*j* is applied to the "1" input of flip-flop B for the logical condition (F) (*a* ), that is, during the rise time of the ramp signal. Flip-flop B is reset to the "0" state by the basic time slot signal *c*, so that it delivers a signal B during at least the basic time slot *b*. This signal is applied to gate P3 which is activated for the logical condition (B) $(\overline{Sj})$ (*b* ) to deliver a signal W*j*. This signal controls the transfer, in line *j* of memory MR, of the code stored at this time in coding counter C2 (FIG. 2). Since signal N*j* is stored in flip-flop B, it is seen that the signal W*j* is produced with a certain delay with respect to signal N*j* and that it may be used for discharging the holding capacitor of the circuit SH. The signal S'*j* delivered by gate P2 controls the activation of gate P4 which delivers a readout signal for the line *j* of memory MR for the logical condition (R*j*)=(s'*j* ) (*c* ). Since the signal S'*j* lasts only for two basic time slots *b* and *c* at the beginning of the signal S*j*, it is assured that the line *j* of the memory MR is read only once during each sampling cycle.

FIGS. *5a* to *5h* illustrate certain signals that appear in the coding circuit M*j*.

FIG. *5a* illustrates the ramp signal, curve 1, and FIG. *5h* illustrates the basic time slot signals. FIG. *5b* illustrates the signal S*j* which has a duration equal to 2 $t_o$ as was chosen with respect to FIG. *3c*.

FIG. *5c* illustrates the signal S'*j* and FIG. *5d* illustrates the readout signal R*j*.

The coding process of the $j^{th}$ sample of amplitude $e_c$ will now be discussed. As it may be seen in FIG. *5a*, signal S*j* controls the charge of the holding capacitor of circuit SH according to curve 2. During the charge, a coincidence between curves 1 and 2 takes place for a value $e'_c$ and comparator G supplies a signal N*j* (1) of duration $t_o$, as has been previously defined. It results, therefrom, that the signal N*j* (1), for example, starts when the ramp voltage is lower than $e'_c$ by *u*/2 and terminates when the ramp signal is higher than $e'_c$ by *u*/2 so that the signal $Nj(1)$ is centered on the cross point of curves 1 and 2. This signal controls the production of signal B (FIG. 5*f*) but this latter signal coincides with signal $Sj$ so that gate P3 is blocked and no signal $Wj$ appears. The signal $S'j$ controls the readout of line $j$ (signal $Rj$, FIG. 5*d*) which is thus ready to receive the code corresponding to the new sampling.

Figures 5A, 5B, 5C, 5D, 5E, 5F, 5G, 5H:
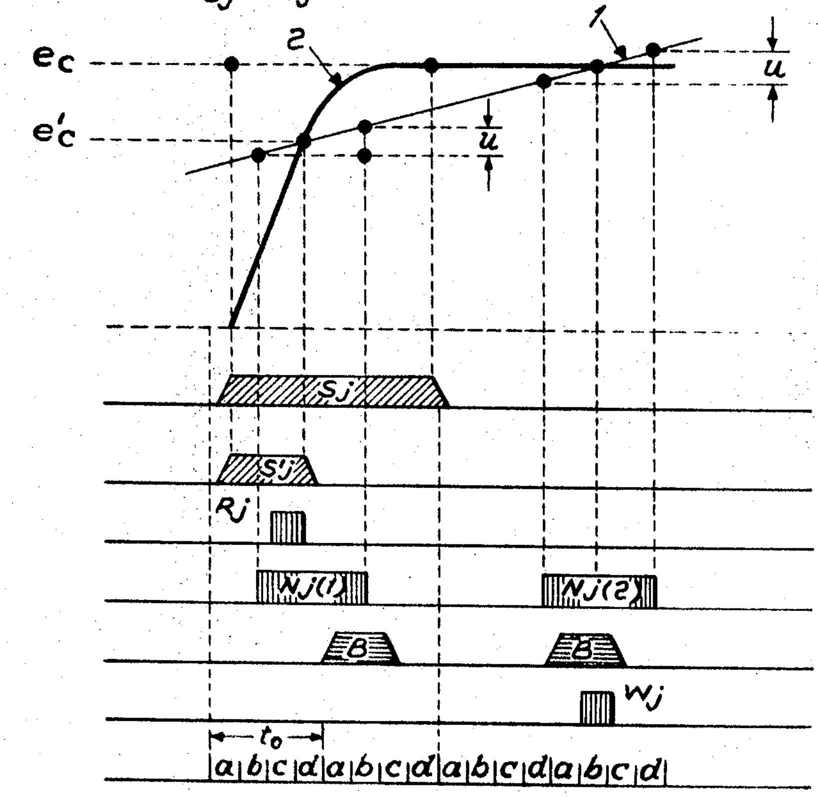
FIGS. 5*a* to 5*h* are curves of signals appearing at various points in the coding circuit of FIG. 4.

At a later time comparator G supplies a new signal $Nj(2)$, after the disappearance of signal $Sj$, when the charging of the holding capacitor of circuit SH is complete, so that flip-flop B is set once again in its "1" state and gate P3 delivers a signal $Wj$ (FIG. 5*g*). This signal, applied to memory MR (FIG. 2) controls the transfer to line $j$ of memory MR, of the code stored at this time in counter C2. With signal $Nj(2)$ centered as shown in FIG. 5*e* the code or count of counter C2 is that code corresponding to the time of coincidence of the ramp signal and the stored analog signal, or to the next highest code.

It will be noticed, by examining FIGS. 5*a* and 5*c* that the time constant of charge of the holding capacitor of sample and hold circuit SH must be chosen such that the charge is carried out in approximately seven basic time slots, that is, the charge of the holding capacitor must be complete during the sampling time defined by signal $Sj$ so that said capacitor is charged to the correct voltage $e_c$ when gate P3 is activated.

The above discussion has been directed to the case where a first sample is made at a time such that the amplitude of the ramp signal is lower than $e_c$. All the possible cases will now be considered by means of FIGS. 3*a* to 3*d* and by setting $Sj$ equal to S2.

Due to the blocking of gate P3 by signal S2, the coding can be carried out only at the end of this signal, this being characterized by the vertical line Z Z′ on FIGS. 3*a* to 3*d*.

If $e_c$ is greater than $e_c$ 2 we have the condition described in relation with FIGS. 5*a* to 5*h* and comparator G delivers a signal $Nj$ in the cycle T1 after the signal $Sj$=S2.

In the case where $e_c=e_c1$ which is equal to or less than $e_c2$, comparator G can deliver a signal $Nj$ only in the next cycle T2 during one of the sampling times $Sm$ or S1. This signal appears while signal S2 is absent and gate P3 is activated to deliver a signal $Wj$.

The correct operation of the coder in all cases is made possible by the fact that $(m-1)(q)=Tz$. In effect, if an equal duration was chosen for the ramp signal cycle and for the sampling cycle, the signal $Nj$ would occur during one of the times S1 or S2 so that it would coincide with the signal S2.

Last, in FIGS. 3*a* to 3*d*, consider the signal $S(m-1)$ of the cycle T1. This latter signal controls the sampling and holding of the voltage $e_c$ appearing at this time slot but as it coincides with the return time of the ramp signal, signal $\overline{F}$ blocks the gate P1 and the coding is carried out during the cycle T2 and the readout out occurs during cycle T3 where the next signal $s(m-1)$ appears.

It is thus seen that the coding takes place with a delay with respect to the storage in memory ranging between zero and Tz, so that this operation is carried out asynchronously whereas the readout under the control of the signals $Rj$ appearing at the beginning of each sampling time is cyclic.

Figures 3A, 3B, 3C, 3D:
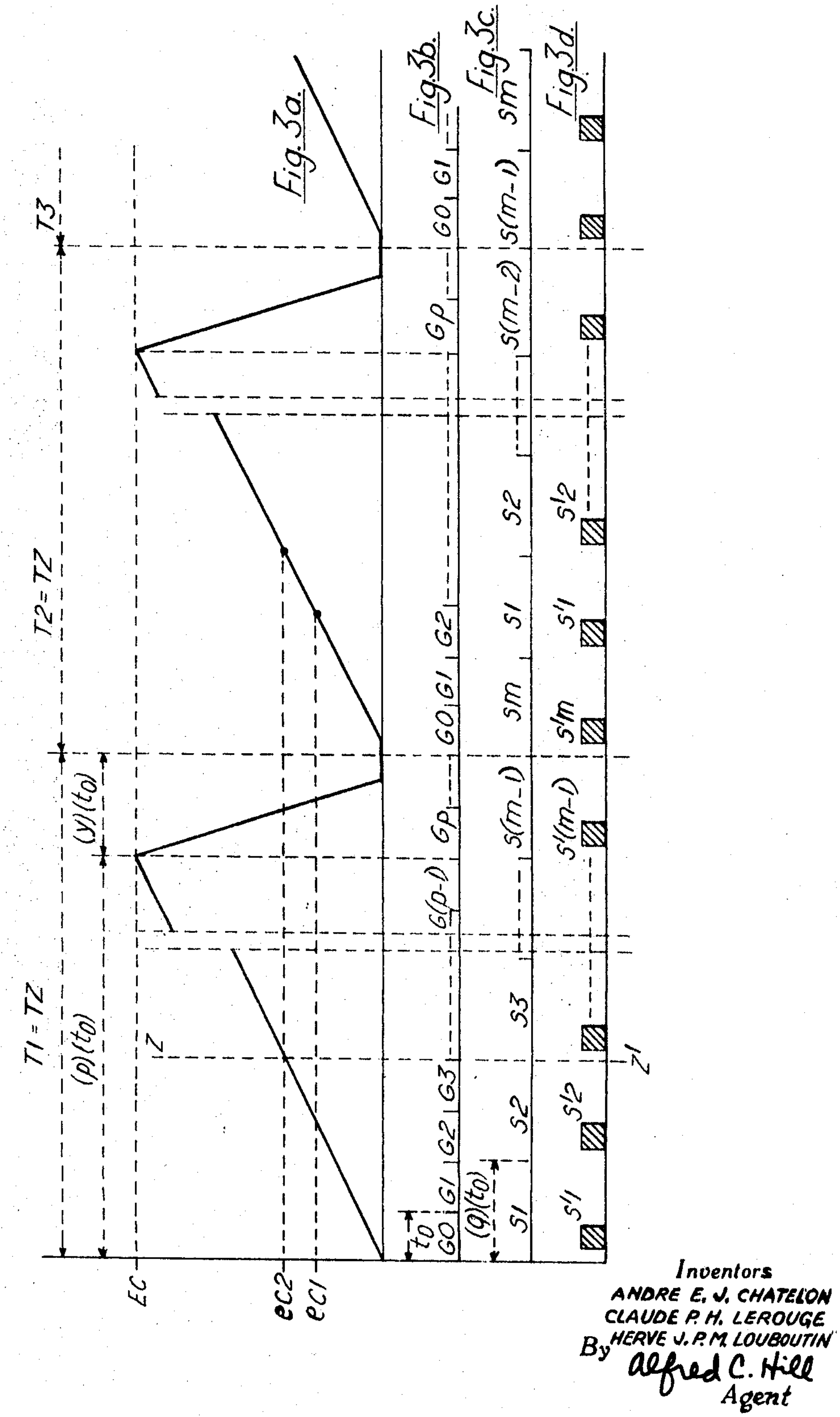
FIGS. 3*a* to 3*d* are curves of signals appearing in various points of the coder of FIG. 2.

As has been previously seen, the $p=2^n$ first codes delivered by coding counter C2 (positions referenced $Go$ to $G(p-1)$, FIG. 3*b*) corresponds to the rise time of the ramp signal Z and are used along for the coding. This code is set up by the signal F applied to gate P1 (FIG. 4).

It is well understood that the numbers transferred to the memory MR are those constituted by the $n$ least significant digits of the code stored in the counter, the most significant digit being used only for counting up to $(p+y-1)$, the next code bringing the counter back to the position Go.

In the coding circuit of FIG. 4, a sampling duration has been fixed equal to that of signal $Sj$. It should be noted that this corresponds to a maximum duration and that it may be reduced up to the duration of the signal $S'j$, or in other words approximately two basic time slots (see FIG. 5*c*). In this limiting case, the sampling in circuit SH and the activation of the gate P3 are carried out under the control of signal $S'j$.

When it is required to design a wide band coder according to the present invention, one must determine the bandwidth $Fc$, determined in general by the capacity in Bauds of the transmission medium, the number of digits $n$ of the codes corresponding to the samples and the effectively return $(y')(t_o)$ of the ramp signal, where $y'$ is equal to or less than $y$.

Owing to the difference of duration between the ramp signal cycle and the sampling cycle, $(m-1)$ samplings of the input signal $e_c$ are carried out during a time Tz, so that equation (4) must be written:

$$Tz=(m-1)/2(k)(Fc) \qquad (4')$$

This equation defines with equation (5), the operation of the coder:

$$Tz/t_o=2^n+y2=q)(m-1) \qquad (5)$$

$t_o$

From equation (5) above it results that:

$$q=\frac{2^n+y}{(m-1)}$$

The parameters $y$ and $m$ are chosen in such a way that the factor $q$ is an integer number of value not too high in order that divider E (FIG. 2) will be of sample design.

By combining equations (4′) and (5) above there is obtained the relationship $fo=2kq$.

This last equation enables the determination of $fo(fo=/t_o)$.

Thus, for instance, for $n=7(2^n=256)$ and $y'=30$, it is possible to chose among the possible solutions either $y=32$, this giving $m=73$, $q=4$ and $Fo/Fc=8$ (with $k=1$), or $y=34$, this giving $m=30$, $q=10$ and $fo/Fc=20$ (with $k=1$).

While we have described above the principles of our invention in connection with specific apparatus it is to be clearly understood that this description is made only be by way of example and not as a limitation to the scope of our invention as set forth in the accompanying claims.

We claim:

1. An encoder for wide band signals comprising:
an $(n+1)$ stage coding counter means, where $n$ is an integer grater than one;
an $m$-line, $n$-column memory means having each of said columns coupled to a different one of $n$ selected ones of said stages of said counter means, where $m$ is an integer greater than one;
an input for a single wide band analog signal;
first means to generate cyclic reference signals each having a given rise time and a given return time;
$m$ second means having their inputs coupled in common to said input and said first means and their outputs coupled to respective ones of said lines of said memory means; and
third means to produce sequential timing signals during each of said reference signals, said third means being directly connected to each of said second means for sequential activation thereof by associated ones of said timing signals and directly connected to said counter means for activation thereof by a selected one of said timing signals, each of said associated ones of said timing signals having a binary "1" condition for a first given period of time and a binary "0" condition for a second given period of time different than said first given period of time during each o f said reference signals;
each of said second means comparing the amplitude of one of said reference signals with the amplitude of said analog signal and producing a write signal during said one of said reference signal and the simultaneous occurrence of said binary "0" condition of said associated ones of said timing signals;
each of said second means produces a read signal during the next succeeding one of said reference signals after said one of said reference signals and the simultaneous occurrence of said binary "1" condition of said associated ones of said timing signals;
each of said write signals transferring the count of said $n$ selected ones of said stages of said counter means at that time to the associated one of said lines of said memory means; and each of said read signals transferring the stored count to external means.

2. An encoder according to claim 1, wherein said counter means includes a binary counter coupled to said third means activated by said selected one of said timing signals.

3. An encoder according to claim 1, wherein said first means includes:

a ramp signal generator; and fourth means coupled to said counter means and said generator to control the operation thereof.

4. An encoder according to claim 1, wherein said counter means includes:

a binary counter having ($n$+1 1) binary weighted stages directly connected to said third means activated by said selected one of said timing signals;

fourth means to couple the $n$ least significant binary weighted ones of said stages of said counter to respective ones of said columns of said memory means; and said first means includes;

a ramp signal generator, a decoder coupled to said ($n$+1) stages of said counter to produce two signals to define said first time, and a flip-flop coupled to said decoder and said generator responsive to said two signals to control the operation of said generator.

5. An encoder according to claim 1, wherein each of said second means includes:

a sample and hold circuit coupled to said input and said third means to store said analog signal under control of said third means;

first logic circuit means coupled to said third means to produce said read signal;

an amplitude comparator coupled to said sample and hold circuit and said first means to produce an output when said stored analog signal and said reference signal have equal amplitude; and second logic circuit means coupled to said comparator and said third means to produce said write signal.

6. An encoder according to claim 5, wherein said sample and hold circuit is coupled to said second logic circuit means responsive to said write signal to remove said stored analog signal from said sample and hold circuit in preparation for the next activation by said third means.

7. An encoder according to claim 1, wherein said counter means includes;

a binary counter coupled to said third means activated by said selected one of said timing signals; and each of said second means includes, a sample and hold circuit coupled to said input and said third means to store said analog signal under control of said, associated ones of said timing signals, first logic circuit means coupled to said third means to produce said read signal, an amplitude comparator coupled to said sample and hold circuit and said first means to produce an output when said stored analog signal and said reference signal have equal amplitude, and second logic circuit means coupled to said comparator, said counter and said third means to produce said write signal.

8. An encoder according to claim 1, wherein;

said first means includes, each of said second means includes, a sample and hold circuit coupled to said input and said third means to store said analog signal under control of said third means, first logic circuit means coupled to said third means to produce said read signal, an amplitude comparator coupled to said sample and hold circuit and said generator to produce an output when said stored analog signal and said ramp signal have equal amplitude, and second logic circuit means coupled to said comparator, said counter means, and said third means to produce said write signal.

9. An encoder according to claim 1, wherein;

said counter means includes, a binary counter having ($n$+1) binary weighted stages directly connected to said third means activated by said selected one of said timing signals, and fourth means to couple the $n$ least significant binary weighted stages of said counter to respective ones of said columns of said memory means;

said first means includes, a ramp signal generator, a decoder coupled to said ($n$+1) stages of said counter to produce two signals to define said rise time, and a flip-flop coupled to said decoder and said generator responsive to said two signals to control the operation of said generator; and each of said second means includes, a sample and hold circuit coupled to said input and said third means to store said analog signal under control of said associated ones of said timing signals, first logic circuit means coupled to said third means to produce said read signal, an amplitude comparator coupled to said sample and hold circuit and said generator to produce an output when said stored analog signal and said ramp signal have equal amplitude, and second logic circuit means coupled to said comparator, said flip-flop and said third means to produce said write signal.

10 An encoder according to claim 9, wherein said sample and hold circuit is coupled to said second logic circuit means responsive to said write signal to remove said stored analog signal from said sample and hold circuit in preparation for the next activation by said third means.